(12) United States Patent
Brownell et al.

(10) Patent No.: US 6,410,982 B1
(45) Date of Patent: *Jun. 25, 2002

(54) HEATPIPESINK HAVING INTEGRATED HEAT PIPE AND HEAT SINK

(75) Inventors: Michael Philip Brownell, Los Gatos; James G. Maveety, San Jose, both of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/432,578

(22) Filed: Nov. 12, 1999

(51) Int. Cl.[7] ............................................. H01L 23/34
(52) U.S. Cl. ........................ 257/714; 257/713; 257/715
(58) Field of Search ................................. 257/712, 713, 257/714, 715, 717, 718, 719, 722, 675, 706, 687; 361/695, 697, 701, 702, 703, 689, 698, 699

(56) References Cited

U.S. PATENT DOCUMENTS

| | | | | |
|---|---|---|---|---|
| 4,620,216 A | * | 10/1986 | Horvath | 257/713 |
| 5,291,064 A | * | 3/1994 | Kurokawa | 257/714 |
| 5,367,765 A | * | 11/1994 | Kusaka | 29/840 |
| 5,699,227 A | | 12/1997 | Kolman et al. | 257/678 |
| 5,780,928 A | * | 7/1998 | Rostoker et al. | 257/713 |
| 5,880,524 A | | 3/1999 | Xie | 257/704 |

FOREIGN PATENT DOCUMENTS

| | | | |
|---|---|---|---|
| JP | 409149598 A | * | 6/1997 |
| JP | 411204972 A | * | 7/1999 |

* cited by examiner

Primary Examiner—Olik Chaudhuri
Assistant Examiner—Theresa T. Doan
(74) Attorney, Agent, or Firm—Kenyon & Kenyon

(57) ABSTRACT

Embodiments of the present invention can dissipate heat and include a top wall including a plurality of hollow fins, a bottom wall, and a plurality of side walls that define an inner cavity. A plurality of condenser regions can be located within the inner cavity, and each one of the plurality of condenser regions can be located within one of the plurality of hollow fins. The inner cavity also can include an evaporator region adjacent said bottom wall.

5 Claims, 5 Drawing Sheets

HEATPIPESINK HAVING INTEGRATED HEAT PIPE AND HEAT SINK

FIELD OF THE INVENTION

Embodiments of the present invention relate to an integrated circuit package.

BACKGROUND OF THE INVENTION

Advances in integrated circuit technology have resulted in integrated circuit devices having increased circuit density, increased clocking frequencies, and increased power consumption. As a result, advanced integrated circuit devices such as microprocessors generate substantial amounts of heat. To maintain the performance and prevent degradation of integrated circuit devices that generate a lot of heat, a package housing an integrated circuit typically is coupled to a heat sink to transfer and dissipate heat away from the integrated circuit device.

Known heat sink methods are generally passive. Such passive methods rely on a heat sink to spread and dissipate the heat from an integrated circuit device and air to convect the heat from the heat sink. Known heat sinks are typically a cast heat sink and part of a two-piece heat transfer system including a package cover and a heat sink bolted to a cast cooling plate of the package cover. Cast heat sinks and cover plates (e.g., cast from copper, aluminum, etc.) can have high heat spreading resistances.

A known two-piece system for spreading heat generated by an integrated circuit device includes a heat sink bolted to a package cover including a heat pipe. The heat pipe of the cover can provide enhanced heat spreading across the cover as compared to a cover including a cast cover plate. Such a bolted, two-piece system, however, includes a thermal interface between the cover and heat sink. That thermal interface can create the largest thermal resistance in the bolted, two-piece system. In view of the foregoing, it can be appreciated that a substantial need exists for a method and apparatus which can more effectively transfer and dissipate heat from an integrated circuit device.

SUMMARY OF THE INVENTION

Embodiments of the present invention can include a heatpipesink that dissipates heat and includes a top wall including a plurality of hollow fins, a bottom wall, and a plurality of side walls. The top wall including the plurality of hollow fins, the bottom wall, and the plurality of side walls can define an inner cavity. The inner cavity may include a plurality of condenser regions, each one of the plurality of condenser regions can be located within one of the plurality of hollow fins. The inner cavity also can include an evaporator region adjacent said bottom wall.

DETAILED DESCRIPTION

Embodiments of apparatus and methods to dissipate heat from an integrated circuit device are described. In the following description, for purposes of explanation, numerous specific details are set forth to provide a thorough understanding of the present invention. It will be obvious, however, to one skilled in the art that the present invention may be practiced without these specific details. In other instances, well known structures and devices are shown in block diagram form. Furthermore, it is readily apparent to one skilled in the art that the specific sequences in which steps are presented and performed are illustrative and it is contemplated that the sequences can be varied and still remain within the spirit and scope of the present invention.

Figure 1:
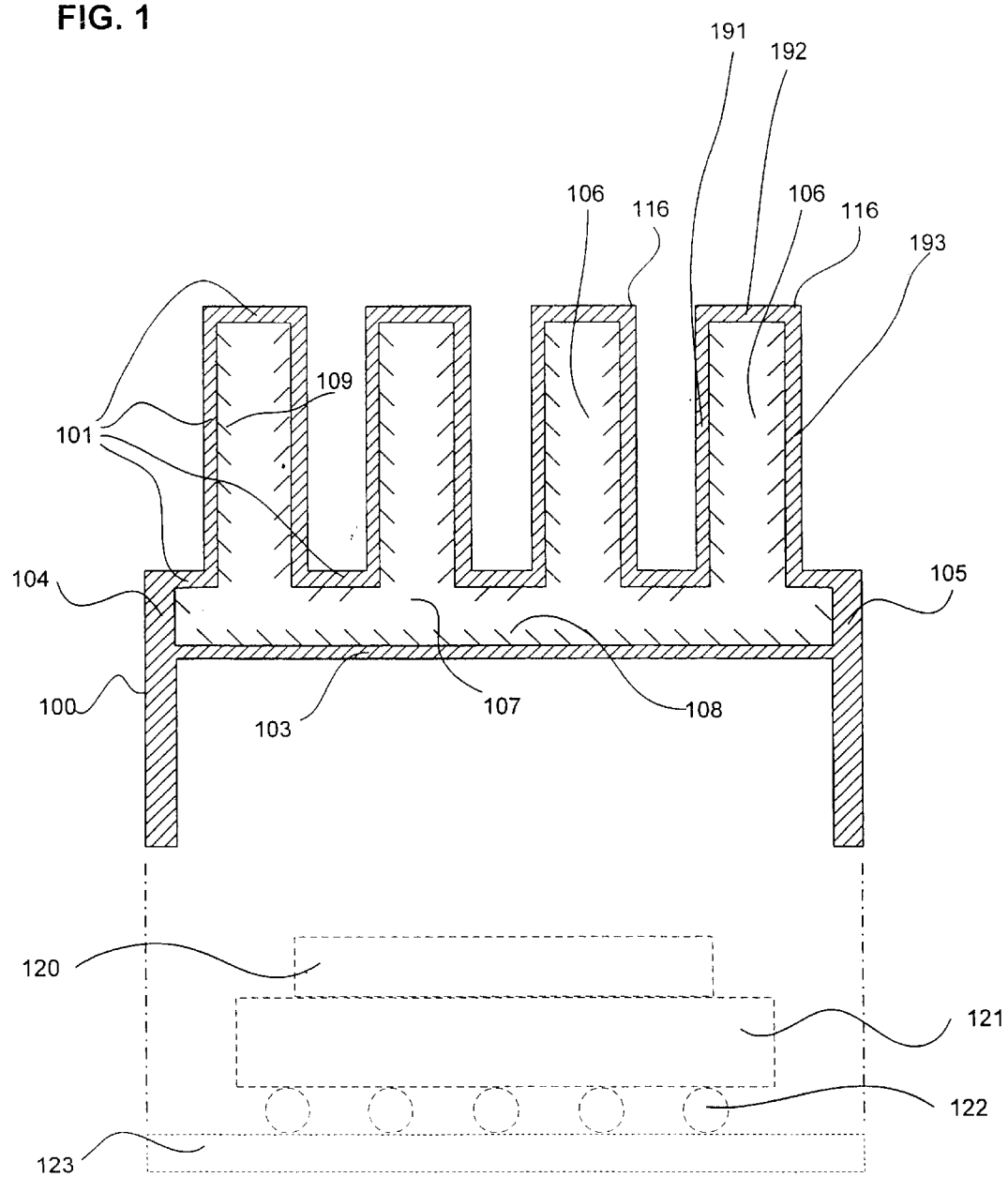
FIG. 1 shows a cross-sectional view of an apparatus in accordance with an embodiment of the present invention.

FIG. 1 shows a cross-sectional view of an apparatus in accordance with an embodiment of the present invention. Heatpipesink 100, in one embodiment, includes a top wall 101 attached to first side wall 104 and second side wall 105. Top wall 101 can include a plurality of hollow fins 116. While heatpipesink 100 as illustrated in FIG. 1 includes four hollow fins 116, other embodiments of a heatpipesink include two hollow fins, three hollow fins, or more than four hollow fins, etc. In one embodiment, each of the plurality of hollow fins 116 is a hollow fin that includes a first vertical fin wall 191, a fin top wall 192, and a second vertical fin wall 193. Heatpipesink 100 can include bottom wall 103 attached to first side wall 104 and second side wall 105. First side wall 104 and second side wall 105 can extend from top wall 101 to beyond bottom wall 103, as is illustrated in FIG. 1. In another embodiment, first side wall 104 and second side wall 105 extends from top wall 101 to bottom wall 103.

In one embodiment, first side wall 104 and second side wall 105 are part of a quadrilateral (e.g., rectangular, trapezoidal, etc.) side wall structure attached to top wall 101 and bottom wall 103 to define an inner cavity 107. In another embodiment, first side wall 104 and second side wall 105 are part of a rounded (e.g., circular, elliptical) side wall structure attached to top wall 101 and bottom wall 103 to define an inner cavity 107. In a further embodiment, first side wall 104 and second side wall 105 are part of a polygonal (e.g., triangular, octagonal, etc.) side wall structure attached to top wall 101 and bottom wall 103 to define an inner cavity 107. A two-phase (e.g., vaporizable) fluid may reside within inner cavity 107. Examples of a two-phase fluid that can reside within embodiments of inner cavity 107 include purified water, freon, etc. Top wall 101, first side wall 104, second side wall 105, and bottom wall 103 can be composed of aluminum, copper, other thermally conductive materials, etc.

Inner cavity 107 may include an evaporator region 108 located adjacent bottom wall 103. Inner cavity 107 can include a plurality of condenser regions 106. In one embodiment, each one of the plurality of condenser regions 106 is located within one of the plurality of hollow fins 116. Heat transmitted through bottom wall 103 and into inner cavity 107 can evaporate the two-phase fluid in the evaporator region 108. Vapor can be condensed to liquid in each of the plurality of condenser regions 106. In one embodiment, the vapor gives up heat as it condenses in a heat pipe fin, and that heat is transmitted out of the inner cavity 107 through the walls of the plurality of hollow fins 116, e.g., through first vertical fin wall 191, fin top wall 192, and second vertical fin wall 193. Inner cavity 107 may also include a wick 109. Condensed vapor (i.e., liquid) can travel along the wick 109 toward the evaporator region 108. In one embodiment, wick 109 includes grooved channels on the interior surface of the walls defining the inner cavity 107. In another embodiment, wick 109 includes a wire mesh.

In one embodiment of the present invention, inner cavity 107 does not include a wick, and each of the plurality of hollow fins acts as a thermosyphon fin. A thermosyphon fin can be less expensive to manufacture than a heat pipe fin. A thermosyphon fin also can be less efficient than a heat pipe fin in terms of heat transfer and dissipation. When a two-phase fluid condenses in a condenser region of a thermosyphon fin, the condensate (i.e., liquid) may drip down the sides of the thermosyphon fin instead of being advantageously transported by the capillary action of a wick of a heat pipe fin.

Heatpipesink 100 can dissipate heat from a material in contact with the bottom wall 103. In one embodiment, heatpipesink 100 can comprise a semiconductor package cover. First side wall 104 and second side wall 105 may extend beyond bottom wall 103 and can be attached to a substrate 123 to enclose an integrated circuit device 121 within a chamber defined by first side wall 104, bottom wall 103, second side wall 105, and substrate 123. Integrated circuit die 121 can be thermally coupled to bottom wall 103 by thermal interface material 120. A plurality of solder bump joints 122 can mechanically and electrically couple integrated circuit die 121 to substrate 123. In one embodiment, integrated circuit device 121 generates heat when it is operated. Thermal interface material 120 transmits the heat to bottom wall 103 from integrated circuit device 121. Bottom wall 103 transmits the heat to the two-phase fluid in inner cavity 107. The heat is transmitted out of the two-phase fluid and out of the heatpipesink 100 through the walls of the plurality of hollow fins 116.

Figure 2:
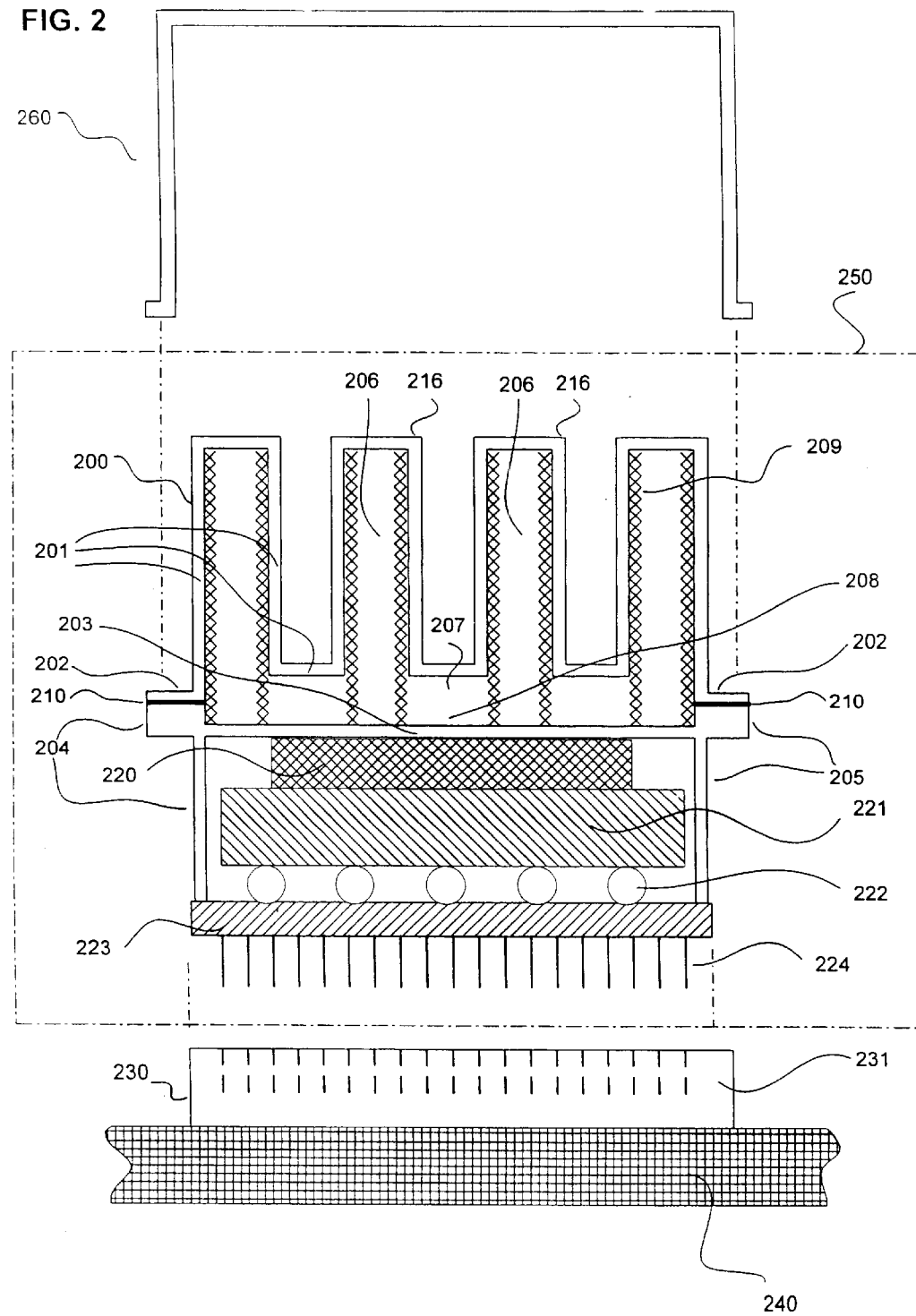
FIG. 2 shows another embodiment of the present invention.

FIG. 2 shows another embodiment of the present invention. Heatpipesink 200, in one embodiment, has a top wall 201 including a plurality of hollow fins 216. Top wall 201 can include a top surface 202. In one embodiment, top wall 201 is attached (e.g., welded, bonded, brazed, adhered, etc.) to a plurality of side walls 204, 205 at joints 210. Top wall 201, the plurality of side walls 204, 205, and a bottom wall 203 can define an inner cavity 207 having an evaporator region 208 located adjacent bottom wall 203. Inner cavity 207 may also include a plurality of condenser regions 206, each of which is located within one of the plurality of hollow fins 216. In one embodiment, inner cavity 207 includes a wire mesh wick 209 and a two-phase fluid (not shown).

Heatpipesink 200 can comprise a package cover of an integrated circuit package 250 and can be attached to a substrate 223 to enclose an integrated circuit device 221 between the heatpipesink 200 and the substrate 223. The integrated circuit device 221 may be thermally coupled to the bottom wall 203 by thermal interface material 220 (e.g., an elastomer type material, a grease and phase change material, etc.). A plurality of solder bump connections 222 can mechanically and electrically couple integrated circuit device 221 to substrate 223. The package 250 can include at least one wiring layer (not shown) to electrically couple integrated circuit device 221 to pins 224. Socket 230, in one embodiment, includes a plurality of pin receptors 231. Package 250 and socket 230 can be mechanically and electrically attached via pins 224 and pin receptors 231. Socket 230, in one embodiment, is mechanically and electrically coupled to circuit board 240.

A plenum cover 260 can be attached to the top surface 202 of top wall 201. In one embodiment, an o-ring seal is disposed between the attachment points of top surface 202 and plenum cover 260. Plenum cover 260 and top wall 201 can define a plenum chamber through which a plenum working fluid can travel.

Figure 3:
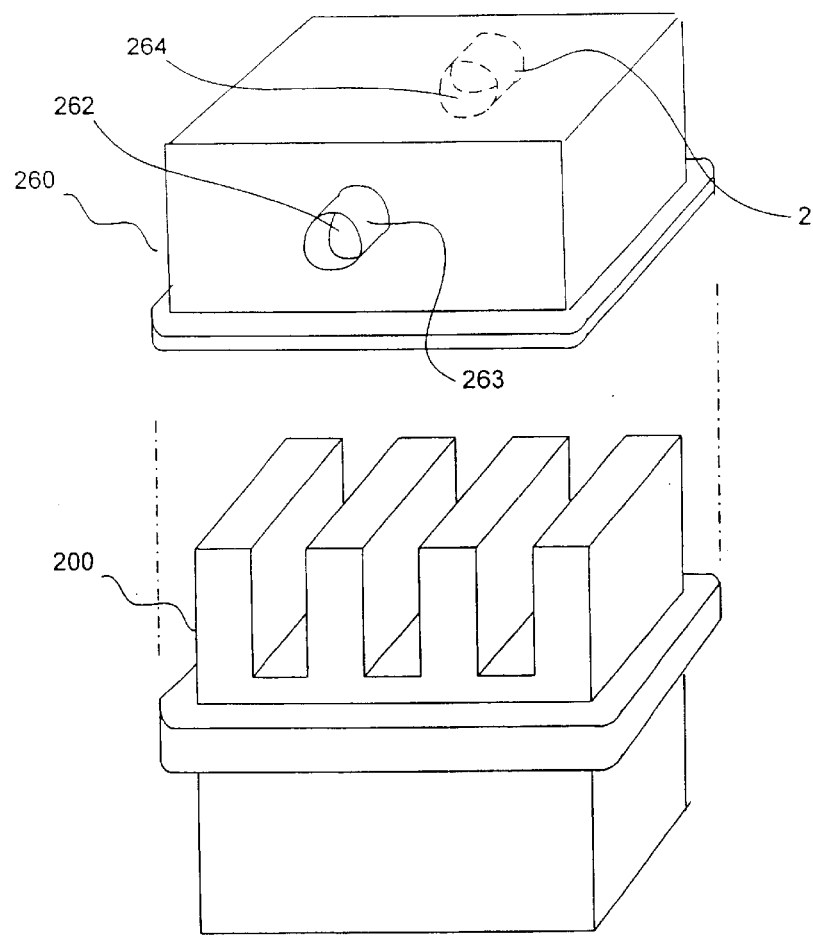
FIG. 3 shows an isometric view of the plenum cover and heatpipesink illustrated in FIG. 2.

FIG. 3 shows an isometric view of the plenum cover 260 and heatpipesink 200 illustrated in FIG. 2. Plenum cover 260 in one embodiment includes a first aperture 262 in a first wall and a second aperture 264 in a second wall of the plenum cover 260. A first collar 263 can be attached to the plenum cover 260 at the first aperture 262, and a second collar 265 can be attached at the second aperture 264. In one embodiment, ducting (not shown) is attached to each of first collar 263 and second collar 265 and a plenum working fluid (e.g., a gas, a liquid, etc.) is forced through the plenum cavity and across the plurality of hollow fins 216 of heatpipesink 200. In another embodiment, plumbing (not shown) is attached to each of first collar 263 and second collar 265 and a plenum working fluid (e.g., a gas, a fluid, etc.) is forced through the plenum cavity and across the plurality of heat pipe fins of heatpipesink 200.

In another embodiment, the plenum cover includes a first aperture in a first plenum wall, and a plenum working fluid is injected into and removed from the plenum chamber via the first aperture. For example, a first pipe coupled to the first aperture can remove plenum working fluid from the plenum chamber. A second pipe coupled to the first aperture and extending into the plenum chamber can inject plenum working fluid into the plenum chamber.

Embodiments of the present invention can provide the capability for both passive and active cooling of an integrated circuit device. An embodiment of the present invention can provide passive cooling by thermally coupling a heatpipesink (e.g. heatpipesink 100 of FIG. 1) to an integrated circuit device in an operational setting (e.g., within a personal computer, workstation, supercomputer, other electronic device, etc.) having an uncontrolled ambient environment. Passive cooling systems can rely on (i) a heat sink to spread and dissipate the heat from an integrated circuit device, and (ii) ambient air to convect the heat from the heat sink. A heatpipesink in accordance with an embodiment of the present invention can provide more efficient heat spreading and dissipation than a known cast heat sink. In one embodiment, the heatpipesink moves heat from the base of the heatpipesink (e.g., a bottom wall 103) to the heat pipe fins (e.g., the plurality of hollow fins 116, each including wick 109) more efficiently than a cast heat sink. A cast heat sink having a base and a plurality of fins may have a high spreading resistance between the base and the fins (e.g., through a cast material) as compared to the spreading resistance through the inner cavity of a heatpipesink in accordance with an embodiment of the present invention.

A heatpipesink in accordance with an embodiment of the present invention may provide efficient heat transfer between a heat source and the fluid (e.g., ambient air, a plenum working fluid, etc.) surrounding the heatpipesink. When a cast heat sink is attached to a package cover to create a two-piece cooling system, a thermal interface is created between the cast heat sink and the package cover. In an embodiment of the present invention, there is no such thermal interface between the bottom wall of the package cover (e.g., the bottom wall 103 of heatpipesink 100) and the heat pipe fins (e.g., the plurality of hollow fins 116, each including wick 109). Elimination of the thermal interface between a package cover (e.g., a package cover including a heat pipe) and a cast heat sink coupled to the package cover is advantageous because thermal interface interactions can create the largest thermal resistance of any two-piece system. Construction of a heatpipesink in accordance with an embodiment of the present invention can eliminate the need for expensive thermal interface materials between the pieces of a two-piece system and flatness requirements (e.g., the flatness of the bottom of the heat sink, the flatness of the top of the package cover, [ensuring that the bondline thickness is maintained], etc.) typically present in the construction of a two-piece system.

An embodiment of the present invention can provide active cooling. Active cooling can result in better cooling of an object producing heat (e.g., an engine, an integrated circuit device, a processor, an amplifier, etc.) than passive cooling due to the use of fluids to aid with heat transfer away from a heat sink. Active cooling may also provide thermal control of an object producing heat. In one embodiment, a device under test (DUT) is thermally coupled to a heatpipesink (e.g., heatpipesink 200 illustrated in FIG. 3), and a plenum cover (e.g., plenum cover 260 illustrated in FIG. 3) is attached to the heatpipesink. Plumbing can be attached to the plenum cover to circulate a plenum working fluid (e.g., a liquid coolant) through the plenum chamber and around the heat pipe fins. In one embodiment, the plenum working fluid is a liquid having thermophysical properties that enhance heat transfer (e.g., $H_2O$/propendal, fluorinert, ethylene glycol/$H_2O$, etc.). Heat from the DUT can first be spread and dissipated by the heatpipesink, and the plenum working fluid can aid in convecting the heat away from the heatpipesink. In such an embodiment, the DUT temperature can be controlled advantageously to set temperature points and/or ranges (e.g., a high temperature extreme, a low temperature extreme, etc.). Higher DUT temperatures may lead to performance degradation resulting in down binning of the device (e.g., the DUT may be binned as a 500 megahertz device as opposed to a 600 megahertz device, etc.). The superior thermal control that can be provided by an embodiment of the present invention can provide more precise binning of devices for a device manufacturer. More precise binning can result in greater revenue for the device manufacturer.

Figure 7:
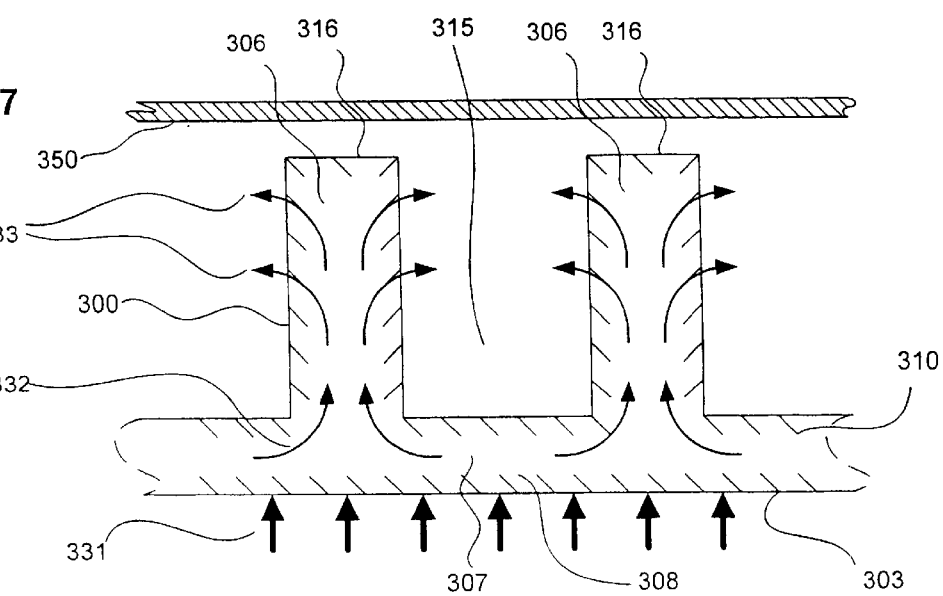
FIG. 7 shows spreading and dissipation of heat in accordance with an embodiment of the present invention.

FIG. 7 shows spreading and dissipation of heat in accordance with an embodiment of the present invention. Plenum cover 350 and heatpipesink 300 are attached to define a plenum chamber 315. Heat 331 can be heat generated by an integrated circuit device (not shown) thermally coupled to bottom wall 303 of heatpipesink 300. Heat 331 can be transmitted across bottom wall 303 into an inner cavity 307 having an evaporator region 308 located adjacent bottom wall 303. In the evaporator region 308, heat 331 may vaporize a two-phase fluid (not shown). The vapor including heat 332 may be carried by convection currents through the inner cavity 307 into the plurality of condenser regions 306, each one of which is located within one of the plurality of heat pipe fins 316. In the plurality of condenser regions 306, as the vapor condenses back to a liquid and gives up heat, heat 333 can be transmitted out of the plurality of heat pipe fins 316 into the plenum chamber 315 where a plenum working fluid (not shown) can further transfer heat out of the plenum chamber 315. Inner cavity 307 can include a wick 310 that aids in moving condensed liquid from the plurality of condenser regions 306 to the evaporator region 300.

Figure 4:
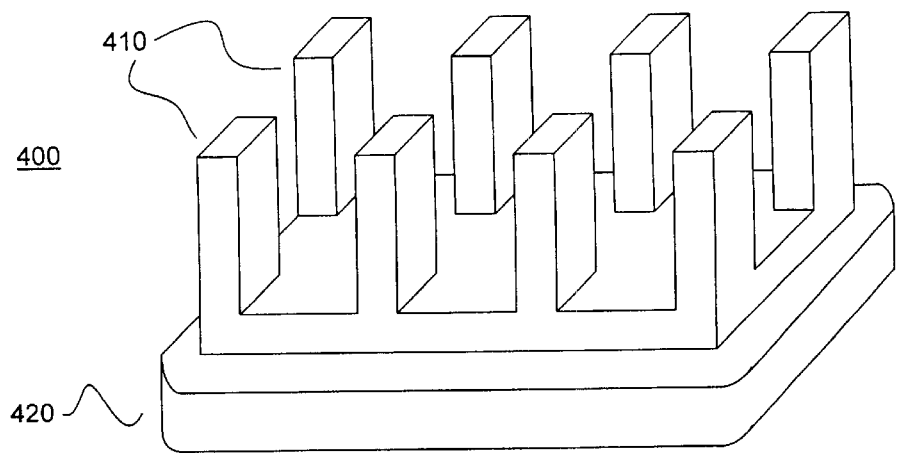
FIG. 4 illustrates another embodiment of a heatpipesink in accordance with an embodiment of the present invention.

FIG. 4 illustrates another embodiment of a heatpipesink in accordance with an embodiment of the present invention. Heatpipesink 400 includes a plurality of heat pipe fins 410 and an attachment flange 420. In one embodiment, and as illustrated in FIG. 4, each of the plurality of heat pipe fins 410 can be a rectangular pinfin. In another embodiment, each of the plurality of heat pipe fins can be a square pinfin.

In a further embodiment, the plurality of heat pipe fins can include a plurality of types of heat pipe fins. Examples of other types of pinfins include circular pinfins, polygonal pinfins, oval pinfins, etc. A plenum cover (not shown) can be attached to the heatpipesink 400 using the attachment flange 420.

Figure 5:
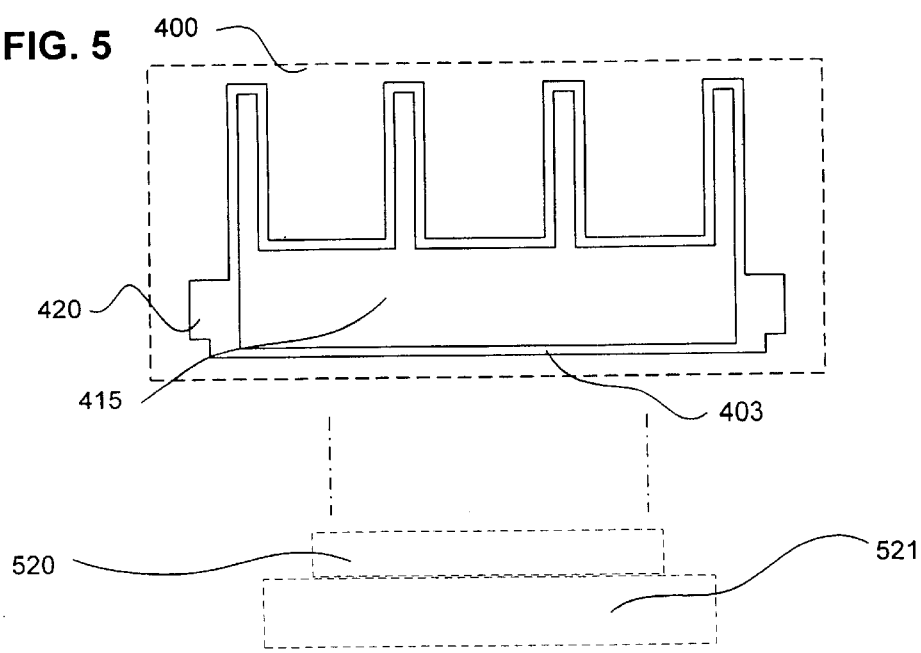
FIG. 5 shows a cross-sectional view of the heatpipesink illustrated in FIG. 4.

FIG. 5 shows a cross-sectional view of the heatpipesink 400 illustrated in FIG. 4. Heatpipesink 400 includes a bottom wall 403 and an inner cavity 415. Attachment flange 420 may be a generic attachment flange to allow attachment of the heatpipesink 400 to an automated pick and place fixture (not shown) that can be used to test the performance an integrated circuit device 521 (e.g., stressing the device by changing environmental conditions and/or running electrical patterns through the device, functionally testing to determine the speed of the device and/or how well it performs operations, a system level test, etc.). In such an embodiment, the heatpipesink 400 can be thermally coupled to integrated circuit device 521 via a thermal interface material 520.

Figure 6:
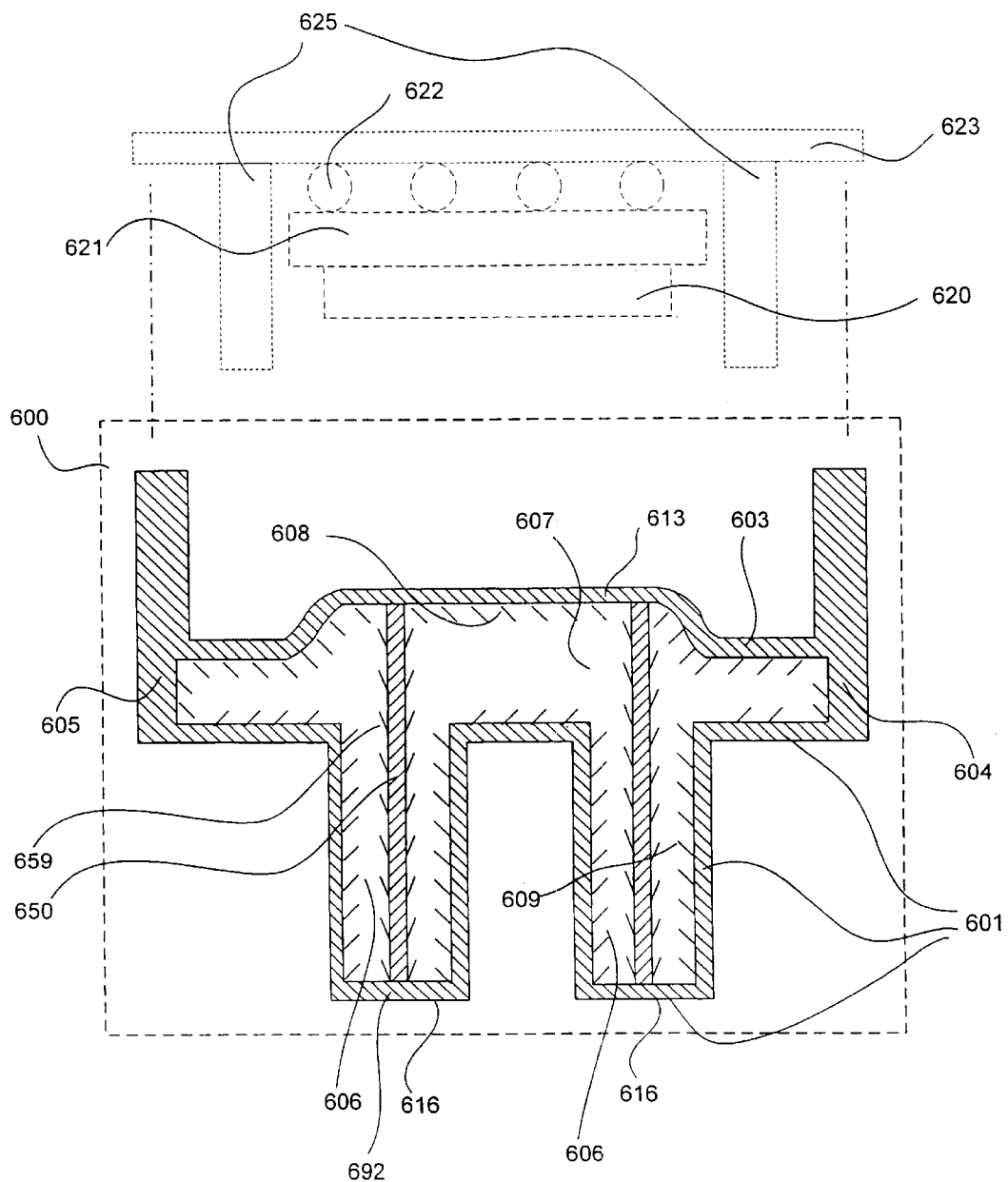
FIG. 6 shows a cross-sectional view of an apparatus in accordance with another embodiment of the present invention.

FIG. 6 shows a cross-sectional view of an apparatus in accordance with another embodiment of the present invention. Heatpipesink 600, in one embodiment, includes a top wall 601 attached to side walls 604, 605. Top wall 601 can include a plurality of heat pipe fins 616. Heatpipesink 600 can include bottom wall 603 attached to side walls 604, 605. Bottom wall 603 can include a lowered platen 613. Top wall 601, bottom wall 603, and side walls 604, 605 can define an inner cavity 607. A two-phase fluid may reside within inner cavity 107.

Inner cavity 607 may include an evaporator region 608 located adjacent lowered platen 613. Inner cavity 607 can include a plurality of condenser regions 606. Each one of the plurality of condenser regions 106 can be located within one of the plurality of heat pipe fins 616. Heat transmitted through lowered platen 613 and into inner cavity 607 can evaporate the two-phase fluid in the evaporator region 608. Vapor can be condensed to liquid in each of the plurality of condenser regions 106. Inner cavity 607 may also include a wick 609 attached to the interior surface of top wall 601, side walls 604, 605, and bottom wall 603. Condensed vapor (i.e., liquid) can travel along the wick 609 toward the evaporator region 608.

A support post 650 can be disposed within inner cavity 607 to structurally reinforce heat pipe fin 616. In one embodiment, support post 650 is attached to an interior surface of a fin top wall 692 of heat pipe fin 616 and to an interior surface of lowered platen 613 of bottom wall 603. In another embodiment, support post 650 is attached in part to an interior surface of bottom wall 603. A support post wick 659 can be attached to support post 650.

Heatpipesink 600 can dissipate heat from a material in contact with the bottom wall 603. In one embodiment, heatpipesink 600 can comprise a semiconductor package cover. Side walls 604, 605 may extend beyond bottom wall 603 and can be attached to a substrate 623 to enclose an integrated circuit device 621 within a chamber defined by side walls 604, 605, bottom wall 103, and substrate 623. Integrated circuit die 621 can be thermally coupled to the lowered platen 613 of bottom wall 603 by thermal interface material 620. A plurality of solder bump joints 622 can mechanically and electrically couple integrated circuit die 621 to substrate 623. In one embodiment, integrated circuit device 621 generates heat when it is operated. Thermal interface material 620 transmits the heat to lowered platen 613 of bottom wall 603 from integrated circuit device 621. Bottom wall 603 transmits the heat to the two-phase fluid in inner cavity 607. The heat is transmitted out of the two-phase fluid and out of the heatpipesink 600 through the walls of the plurality of heat pipe fins 616.

In one embodiment, the lowered platen 613 of bottom wall 603 provides for an advantageous thermal interface between heatpipesink 600 and integrated circuit device 621 that accommodates tall components 625 (e.g., components that are taller than the total height of an integrate circuit device and a thermal interface material, etc.) disposed within the semiconductor package and electrically coupled to the integrated circuit device 621. Examples of components 625 include chip inductors, capacitors, etc.

As illustrated in FIG. 6, heatpipesink 600 can be part of a semiconductor package that is operated in an upside down position. In one such embodiment, heat pipe fins 616 can be pointed down such that liquid present within the inner cavity 607 may pool within the heat pipe fins 616 (e.g., toward the fin top wall 692) due to gravitational forces acting upon the liquid. The support post wick 659 can improve wicking of the liquid from the heat pipe fins 616 toward the evaporator region 608 when the semiconductor package is operated in an upside down position.

Embodiments of the present invention advantageously allow heat to be spread and dissipated from an integrated circuit device. In one embodiment, a heatpipesink can comprise a package cover and include heat pipe fins that lacks the thermal interface typically present between a package cover and a cast heat sink. Such an embodiments can provide a more efficient heat transfer than a package cover/cast heat sink combination. In another embodiment, the heatpipesink advantageously spreads heat from the base of a heat sink to the fins of the heat sink more efficiently than known cast heat sinks.

In the foregoing detailed description, apparatus and methods in accordance with embodiments of the present invention have been described with reference to specific exemplary embodiments. Accordingly, the present specification and figures are to be regarded as illustrative rather than restrictive.

What is claimed is:

1. A circuit board assembly, comprising:

a circuit board; and a semiconductor package coupled to said circuit board, said semiconductor package including an integrated circuit device, a substrate, and a package cover, said package cover including
 a top wall including a plurality of hollow fins,
 a bottom wall, said integrated circuit device thermally coupled to said bottom wall,
 a plurality of side walls, and
 a plurality of channels,
 said top wall, including said plurality of hollow fins, and said bottom wall being attached to said plurality of side walls to define an inner cavity,
 said inner cavity including
  a plurality of condenser regions, each one of said plurality of condenser regions located within one of said plurality of hollow fins, and
  an evaporator region adjacent said bottom wall,
 said plurality of channels attached to and extending from the interior surface of said inner cavity within said condenser and evaporator regions,
 wherein said bottom wall and said substrate are attached to said plurality of side walls to enclose said integrated circuit device.

2. The circuit board assembly of claims 1, further comprising a two-phase fluid disposed within said inner cavity.

3. The circuit board assembly of claim 1, further comprising a wick disposed within said inner cavity.

4. The circuit board assembly of claim 1, further comprising a plenum cover attached to said package cover.

5. The circuit board assembly of claim 4, wherein said plenum cover includes an aperture in a wall of said plenum cover, said plenum cover and said package cover define a plenum chamber, and said plenum chamber includes a plenum working fluid received through said aperture.

* * * * *